(12) United States Patent
Sakata

(10) Patent No.: US 7,566,617 B2
(45) Date of Patent: Jul. 28, 2009

(54) METHOD FOR MANUFACTURING SEMICONDUCTOR ELEMENTAL DEVICE FORMING AN AMORPHOUS HIGH DIELECTRIC FILM AND AN AMORPHOUS SILICON FILM

(75) Inventor: Toyokazu Sakata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 202 days.

(21) Appl. No.: 11/366,384

(22) Filed: Mar. 3, 2006

(65) Prior Publication Data

US 2006/0199327 A1 Sep. 7, 2006

(30) Foreign Application Priority Data

Mar. 4, 2005 (JP) .............................. 2005-061167

(51) Int. Cl.
*H01L 21/336* (2006.01)
*H01L 21/20* (2006.01)
*H01L 21/36* (2006.01)

(52) U.S. Cl. ...................................... 438/261; 438/487
(58) Field of Classification Search ................. 438/261, 438/487; 257/E21.13, E21.412
See application file for complete search history.

(56) References Cited

U.S. PATENT DOCUMENTS 6,818,516 B1* 11/2004 Lo et al. ..................... 438/287
6,998,303 B2* 2/2006 Sugita et al. ................. 438/199
2002/0072180 A1* 6/2002 Yugami et al. ............... 438/299
2003/0104706 A1* 6/2003 Mitsuhashi et al. .......... 438/756
2004/0113171 A1* 6/2004 Chiu et al. ................... 257/119
2005/0019990 A1* 1/2005 Chang ........................ 438/149

FOREIGN PATENT DOCUMENTS

JP 2003-332295 11/2003

\* cited by examiner

*Primary Examiner*—William M Brewster
(74) *Attorney, Agent, or Firm*—Volentine & Whitt, P.L.L.C.

(57) ABSTRACT

A base substrate is first prepared, and a high dielectric amorphous film composed of a high permittivity material is formed over the base substrate. Next, an amorphous silicon film is formed over the high dielectric amorphous film with an amorphization temperature of the high permittivity material as a deposition temperature. Then, the amorphous silicon film is processed by a photolithography method and dry etching to form gate electrode forming films. Wet etching with the gate electrode forming films as masks is next performed to allow portions of the high dielectric amorphous film, which are covered with the gate electrode forming films to remain and remove exposed portions of the high dielectric amorphous film. Next, the gate electrode forming films are thermally treated to reform amorphous silicon into polysilicon so as to constitute gate electrodes.

9 Claims, 4 Drawing Sheets

METHOD FOR MANUFACTURING SEMICONDUCTOR ELEMENTAL DEVICE FORMING AN AMORPHOUS HIGH DIELECTRIC FILM AND AN AMORPHOUS SILICON FILM

BACKGROUND OF THE INVENTION

The present invention relates to a method for manufacturing a semiconductor elemental device. Thinning of a gate insulating film of a MOS (Metal-Oxide-Semiconductor) transistor has been underway with miniaturization and speeding up of a semiconductor elemental device. In a conventionally-used gate insulating film formed of an oxide film, however, a leakage current begins to flow therein when its thickness reaches 2 nm or less, thus resulting in an increase in power consumption. Therefore, the introduction of a high permittivity material higher in permittivity than a silicon oxide film has been discussed as the gate insulating film in 65-nm generation and later devices.

An oxide film conversion thickness obtained by converting the thickness of a gate insulating film formed of a high permittivity material to an oxide film is defined as the oxide film conversion thickness=(permittivity of oxide film/permittivity of dielectric)×actual thickness as is well known. Since the actual thickness can be increased with a material high in permittivity, the application of the high permittivity material to the gate insulating film is a means effective in suppressing the leakage current.

A conventional method for manufacturing a semiconductor elemental device will be explained with reference to FIG. 4 (refer to, for example, a patent document 1 (Japanese Unexamined Patent Publication No. 2003-332295)).

An SOI substrate having a structure in which an insulating layer 14 and an SOI (Silicon on Insulator) layer 16 are laminated over a support substrate 12 in this order, is first prepared as a semiconductor substrate 10 (see FIG. 4(A)).

Next, device isolation insulating layers 18 are formed in the SOI layer 16 of the semiconductor substrate 10 by a local oxide of silicon (LOCOS) method to perform device isolation with respect to active regions. A substrate in which the device isolation insulating layers 18 are formed in the SOI layer 16 is referred to as a bed or base substrate 11. Incidentally, portions of the active regions in the SOI layer 16 are called active SOI layers 17. Next, a high dielectric film 56 and a polysilicon film 65 are sequentially stacked over the base substrate 11 (see FIG. 4(B)).

Next, photoresist masks 70 are formed on the polysilicon film 65 corresponding to each gate forming region 72 by a photolithography method (see FIG. 4(C)).

Next, dry etching using the photoresist masks 70 is carried out to remove the polysilicon film 65 corresponding to each gate non-forming region 74, thereby constituting the polysilicon film 65 that remains in each gate forming region 72, as a gate electrode 67 (see FIG. 4(D)).

Next, the photoresist masks 70 are removed by ashing. Thereafter, portions of the high dielectric film 56 corresponding to the gate non-forming regions 74 are removed by low-temperature wet etching using hydrofluoric acid as an etchant (see FIG. 4(E)).

When, however, for example, hafnium oxide ($HfO_2$) whose crystallization temperature (ranging from 500 to 600° C.) is lower than a deposition temperature of polysilicon is applied to a gate insulating film as a high permittivity material, a high dielectric film of $HfO_2$ is crystallized upon deposition or growth of polysilicon. When the high dielectric film is crystallized, there is a fear that an etching rate of the high dielectric film is reduced or no etching proceeds.

A method has also been reported wherein even when the high dielectric film is crystallized in contrast to this, a plasma etching process using HBr, $CL_2$ or an $O_2$ gas is performed following dry etching for forming a gate electrode (refer to, for example, T. Maeda et al., Ext. Abstracts, SSDM, p. 828 (2003)). According to this method, a crystallized high dielectric film is damaged using an ion impact by the plasma etching process so as to be amorphized, after which its amorphized damage layer is removed by wet etching.

There is however a fear that the HBr, $Cl_2$ or $O_2$ gas used for the formation of the damage layer damages the crystallized high dielectric film and amorphizes the high dielectric film and at the same time etches polysilicon corresponding to the gate electrode.

SUMMARY OF THE INVENTION

The present invention has been made in view of the above problems. An object of the present invention is to provide a method for manufacturing a semiconductor elemental device, which avoids a reduction in etching rate due to crystallization of a high dielectric film and increases a selection ratio with respect to a gate electrode.

According to one aspect to of the present invention, for attaining the above object, there is provided a method for manufacturing a semiconductor elemental device, comprising the steps of preparing a base substrate, forming a high dielectric amorphous film composed of a high permittivity material over the base substrate, forming an amorphous silicon film over the high dielectric amorphous film with an amorphization temperature of the high permittivity material as a deposition temperature, forming photoresist masks over the amorphous silicon film in gate forming regions by a photolithography method, removing the amorphous silicon film in gate non-forming regions by dry etching using the photoresist masks to expose the high dielectric amorphous film and allow the amorphous silicon film in the gate forming regions to remain to thereby form gate electrode forming films, removing the photoresist masks and thereafter performing wet etching with the gate electrode forming films as masks to thereby allow portions of the high dielectric amorphous film, which are covered with the gate electrode forming films to remain and remove exposed portions of the high dielectric amorphous film, and heat-treating the gate electrode forming films to reform amorphous silicon into polysilicon and constituting the same as gate electrodes.

According to the semiconductor elemental device manufacturing method of the present invention, the amorphous silicon film is formed over the high dielectric amorphous film with the amorphization temperature of the high permittivity material as the deposition temperature. Thereafter, the high dielectric amorphous film and the amorphous silicon film are etched. It is thus possible to avoid a reduction in etching rate due to the crystallization of the high dielectric amorphous film.

Since the etching rate of the high dielectric film is not reduced, i.e., a selection ratio with respect to the amorphous silicon becomes large, the fear of thinning or the like of the gate electrode due to side etching at the etching of the high dielectric film is reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

While preferred embodiments of the present invention will hereinafter be described with reference to the accompanying drawings, the constitution and physical layout relationship are merely approximate illustrations to enable an understanding of the present invention. While preferred configurational examples of the present invention are explained below, the composition (material) for each constitution and the numerical conditions or the like are nothing more than mere preferred examples. Accordingly, the present invention is not limited to the following embodiments.

First Preferred Embodiment

Figure 1A:
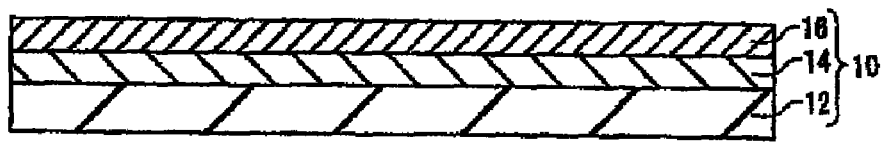
FIG. 1 is a process diagram (part 1) showing a method for manufacturing a semiconductor elemental device, according to a first embodiment.
Figure 1B:
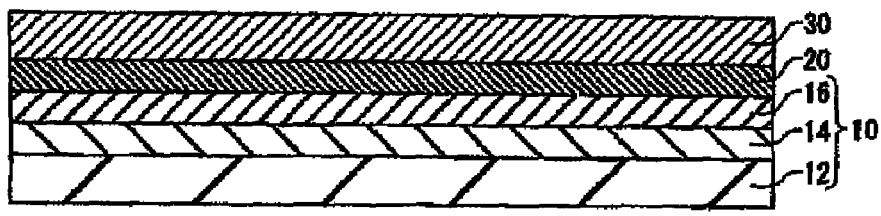
Figure 1C:
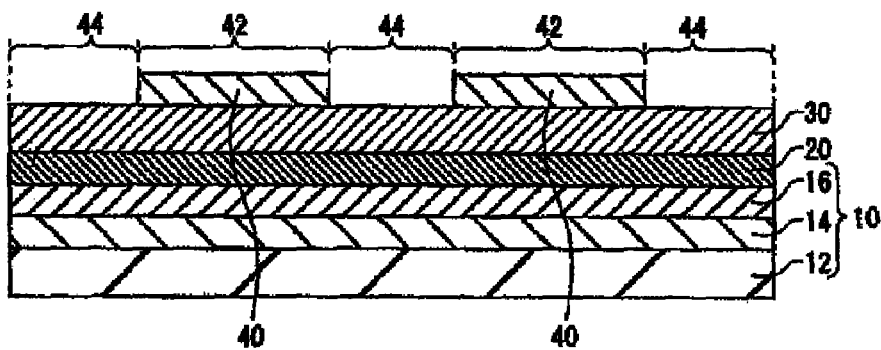
Figure 1D:
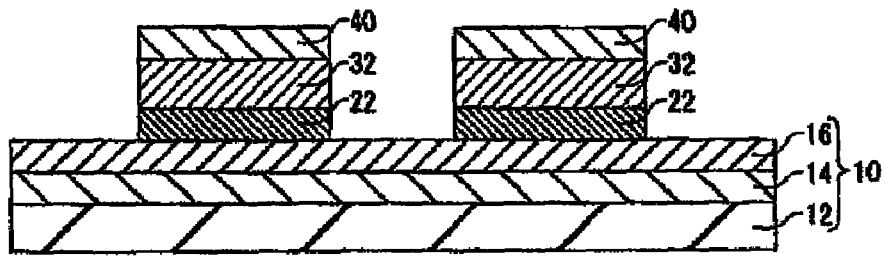
Figure 1E:
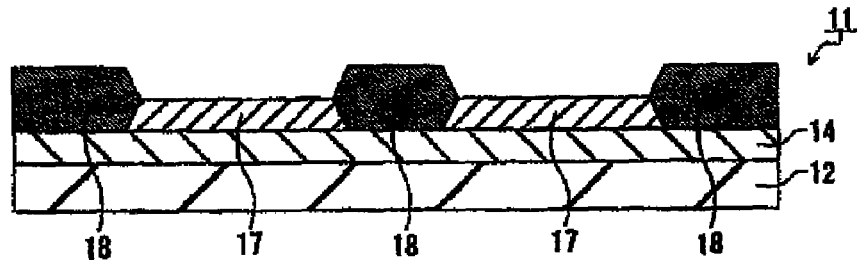
Figure 2:
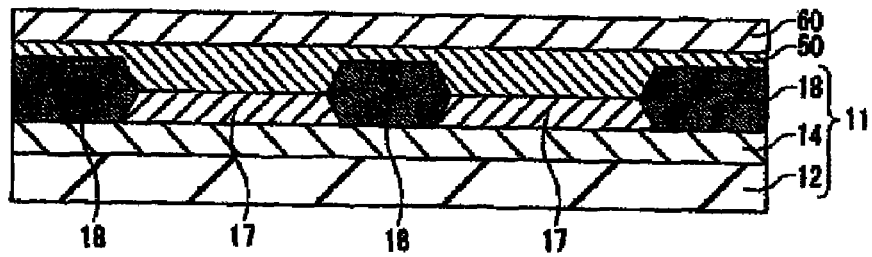
FIG. 2 is a process diagram (part 2) illustrating the method for manufacturing the semiconductor elemental device, according to the first embodiment.
Figure 2:
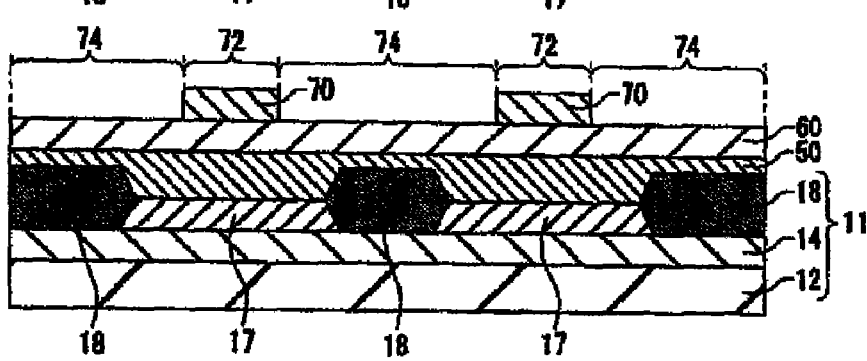
Figure 2:
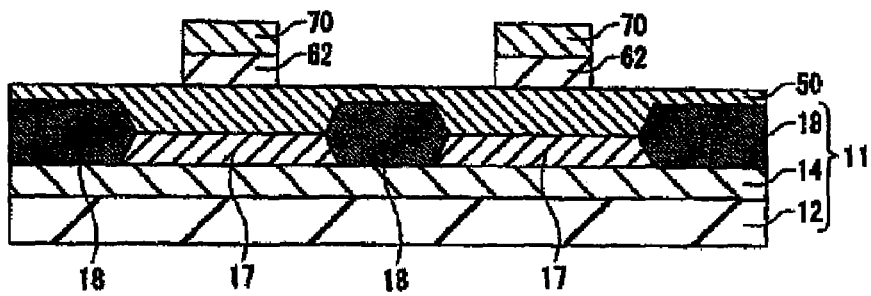
Figure 2:
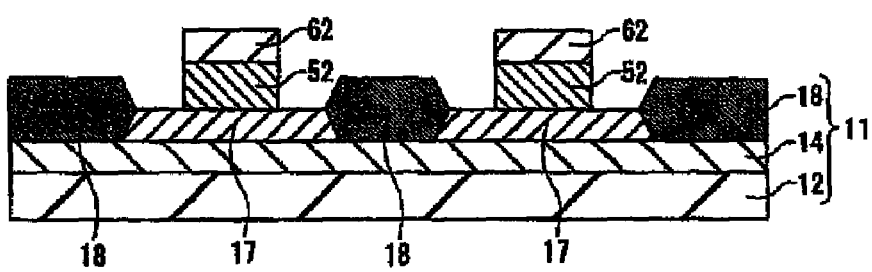
Figure 2:
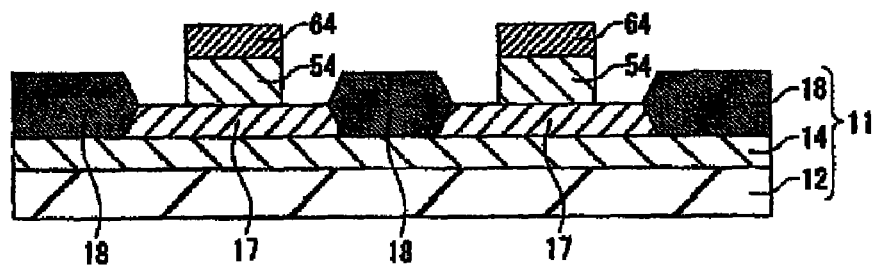
Figure 3A:
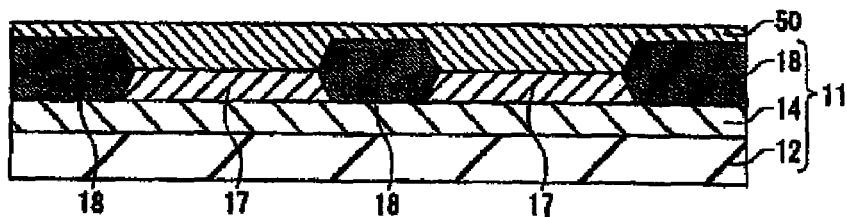
FIG. 3 is a process diagram showing a method for manufacturing a semiconductor elemental device, according to a second embodiment.
Figure 3B:
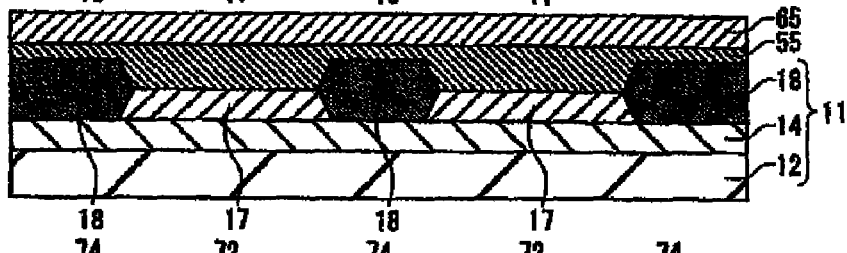
Figure 3C:
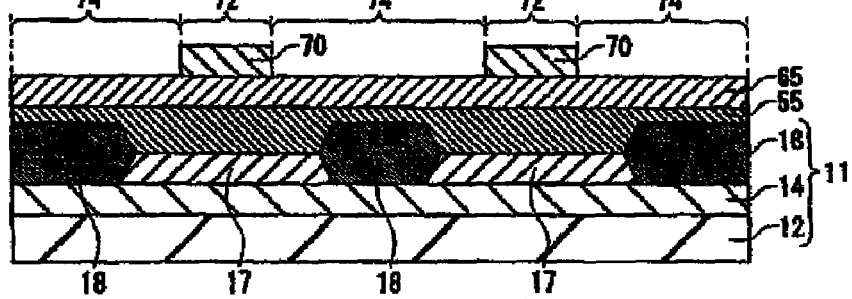
Figure 3D:
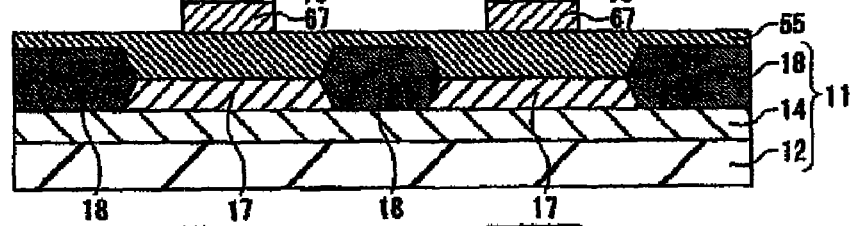
Figure 3E:
Figure 3F:
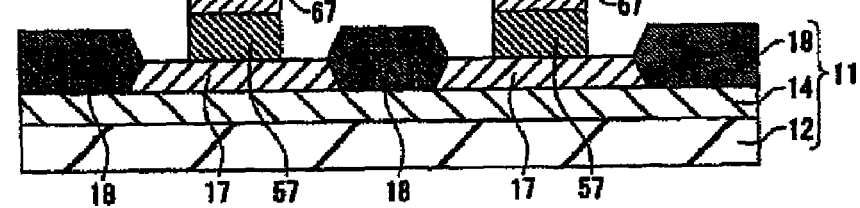
Figure 4A:
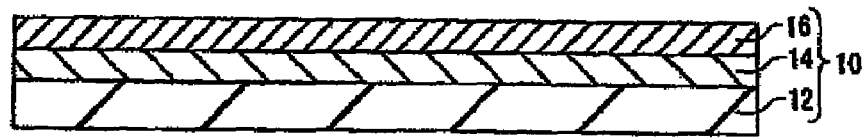
FIG. 4 is a process diagram illustrating a conventional semiconductor elemental device manufacturing method.
Figure 4B:
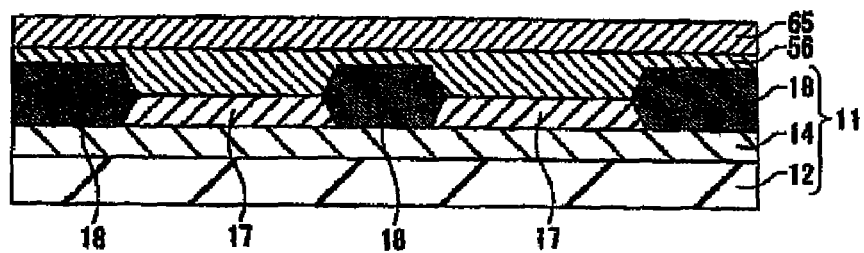
Figure 4C:
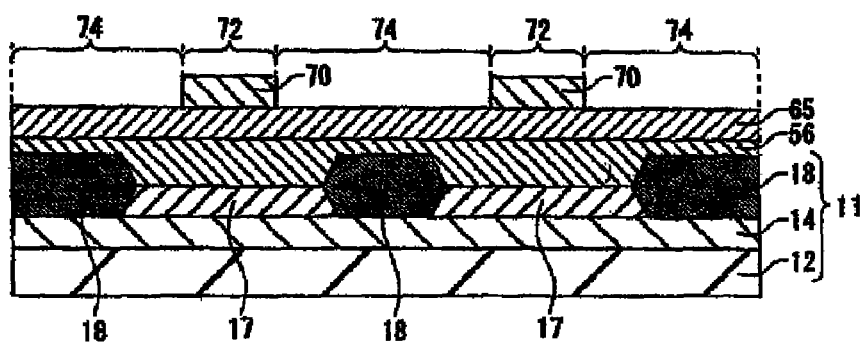
Figure 4D:
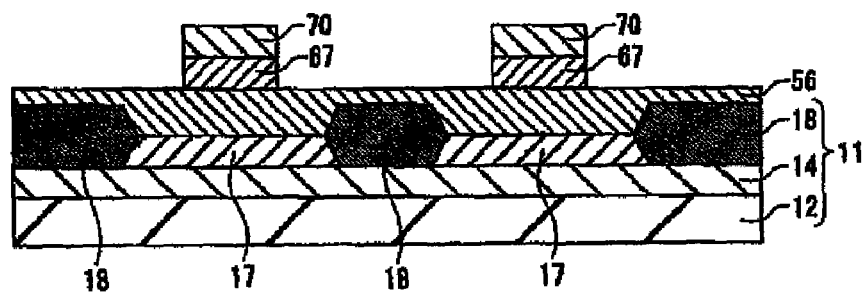
Figure 4E:
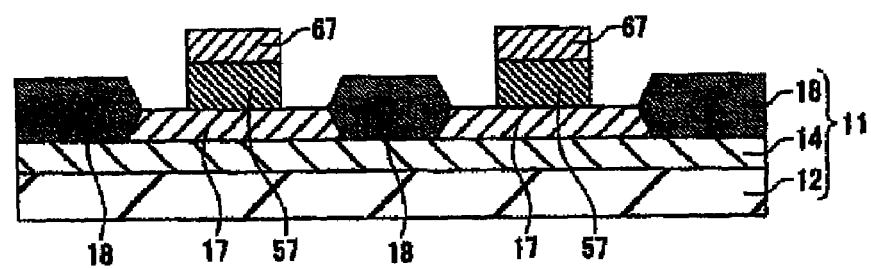

FIGS. 1 and 2 are schematic process diagrams for describing a method for manufacturing a semiconductor elemental device, according to a first embodiment and are shown in sectional cut areas, respectively.

A semiconductor substrate 10 is first prepared. A description will be made of a case in which an SOI substrate having a structure wherein an insulating layer 14 and an SOI (Silicon on Insulator) layer 16 are laminated over a support substrate 12 in this order, is used as the semiconductor substrate 10. Incidentally, the semiconductor substrate 10 is not limited to the SOI substrate but may use an SOS (Silicon on Sapphire) substrate or the like (see FIG. 1(A)).

Next, a pad oxide film 20 is formed on an SOI layer 16 of the semiconductor substrate 10 by a thermal oxidation method, for example. Thereafter, a silicon nitride film 30 is formed on the pad oxide film 20 by an arbitrary and suitable known chemical vapor deposition (CVD) method or the like (see FIG. 1(B)).

Next, a photoresist is applied onto the silicon nitride film 30 and thereafter patterned by a photolithography method to form photoresist masks 40. The photoresist masks 40 are formed so as to cover portions of the silicon nitride film 30 corresponding to preset active regions 42 and expose portions of the silicon nitride film 30 corresponding to device or element isolation regions 44 (see FIG. 1(C)).

Next, the portions of the silicon nitride film 30 corresponding to the device isolation regions 44 and portions of the pad oxide film 20 corresponding to the device isolation regions 44 are continuously removed in sequence by dry etching with the photoresist masks 40 as etching masks to expose the SOI layer 16. At this time, the portions of the silicon nitride films 32 corresponding to the active regions 42 and the portions of the pad oxide films 22 corresponding to the active regions 42 are left behind (see FIG. 1(D)).

Next, the photoresist masks 40 are removed by ashing. Thereafter, portions of the SOI layer 16 corresponding to the device isolation regions 44 are dry-oxidized to change to device isolation insulating layers 18. Afterwards, both the remaining portions of the silicon nitride films 32 and pad oxide films 22 are removed by dry etching. Incidentally, although a description has been made here, of the example in which a local oxide of silicon (LOCOS) method is used to form the device isolation insulating layers 18, the device isolation insulating layers 18 may be formed by STI (Shallow Trench Isolation). In the following description, a structure in which the device isolation insulating layers 18 are formed in the SOI layer 16 of the semiconductor substrate 10 is referred to as a base or bed substrate 11. Portions corresponding to the active regions, of the SOI layer 16 are referred to as active SOI layers 17 (see FIG. 1(E)).

Next, a high dielectric amorphous film 50 composed of a high permittivity material is formed on the base substrate (might be called simply "substrate") 11. In the present embodiment, an amorphous high dielectric film (high dielectric amorphous film) 50 is formed by an atomic layer deposition (ALD) method using hafnium oxide ($HfO_2$) as a high dielectric material. Incidentally, since the crystallization temperature of $HfO_2$ ranges from 500° C. to 600° C., the high dielectric amorphous film 50 is formed at a temperature ranging from 350 to 400° C., corresponding to a temperature (hereinafter called "amorphization temperature") lower than the crystallization temperature.

Next, an amorphous silicon film 60 is formed on the high dielectric amorphous film 50 by, for example, the arbitrary and suitable known CVD method. In order to prevent crystallization of the high dielectric amorphous film 50 of $HfO_2$, the deposition temperature of the amorphous silicon film 60 is set to the amorphization temperature of $HfO_2$. Incidentally, the amorphous silicon film 60 is preferably deposited at about 450° C. to obtain uniformity or obtain a sufficient deposition rate (see FIG. 2(A)).

Next, the amorphous silicon film 60 and the high dielectric amorphous film 50 are patterned.

In the present patterning process, a photoresist is first applied onto the amorphous silicon film 60 and thereafter patterned by a photolithography method to form photoresist masks 70. The photoresist masks 70 are formed so as to cover portions of the amorphous silicon film 60 corresponding to gate forming regions 72 and expose portions of the amorphous silicon film corresponding to gate non-forming regions 74 (see FIG. 2(B)).

Next, the portions of the amorphous silicon film 60 corresponding to the gate non-forming regions 74 are removed by arbitrary and suitable known dry etching with the photoresist masks 70 as etching masks. Further, the portions of the amorphous silicon film 60 corresponding to the gate forming regions 72 are left behind by the dry etching. The remaining portions of the amorphous silicon film 60 are constituted as gate electrode forming films 62 respectively (see FIG. 2(C)).

Next, the photoresist masks 70 are removed by ashing. Thereafter, portions of the high dielectric amorphous film 50 corresponding to the gate non-forming regions 74 are removed by wet etching with the gate electrode forming films 62 as masks. The portions of the high dielectric amorphous film 50, which have remained by the wet etching, constitute gate insulating films 52. Incidentally, a hydrofluoric commercially available one can be used as an etchant used for the wet etching (see FIG. 2(D)).

Next, amorphous silicon is reformed into polycrystalline silicon (polysilicon) by thermal treatment in an atmosphere at 600° C. or higher with respect to the gate electrode forming films 62, thus resulting in gate electrodes 64. At this time, the gate insulating films 52 each formed of the amorphous high dielectric film are also crystallized, thus resulting in gate insulating films 54 each formed of a high dielectric crystal film (see FIG. 2(E)).

After the formation of the gate electrodes 64, for example, the formation of sidewalls, the formation of an LDD (Light Doped Drain) structure, and the like may be executed in accordance with the conventional known process. Therefore, their explanations will be omitted here.

According to the semiconductor elemental device manufacturing method of the first embodiment, the high dielectric amorphous dielectric film is formed on the base substrate as the amorphous high dielectric film. Further, the amorphous silicon film is formed on the high dielectric amorphous film with the amorphization temperature of the high permittivity material as the deposition temperature. Therefore, the high dielectric amorphous film is not crystallized and remains amorphous upon the formation of the amorphous silicon. Thus, a reduction in etching rate can be avoided by crystallization of the high dielectric amorphous film.

Since the etching rate of the high dielectric film is not reduced, that is, a selection ratio to the amorphous silicon becomes large, the fear of thinning or the like of each gate electrode by side etching upon etching of the high dielectric film is reduced.

Incidentally, although a description has been made here, of the example in which the high permittivity material is constituted as $HfO_2$, its material is not limited to $HfO_2$. The method for manufacturing the semiconductor elemental device according to the first embodiment can be applied to a high permittivity material corresponding to a so-called etching-resistant material whose crystallization temperature is lower than the deposition temperature of polysilicon and which is hard to be subjected to post-crystallization etching.

Second Preferred Embodiment

FIG. 3 is a schematic process diagram for describing a method for manufacturing a semiconductor elemental device, according to a second embodiment and is shown in sectional cut areas.

Since the process steps up to the formation of a base substrate 11 are similar to the first embodiment described with reference to FIG. 1, their explanations will be omitted.

A high dielectric amorphous film 50 formed of a high permittivity material is formed over the base substrate 11. In the present embodiment, a high dielectric film is formed by an ALD method using hafnium oxide ($HfO_2$) as a high permittivity material. Incidentally, the crystallization temperature of $HfO_2$ ranges from 500° C. to 600° C. Therefore, when the high dielectric film is formed at a temperature ranging from 350 to 400° C. corresponding to an amorphization temperature, the high dielectric film is formed as the high dielectric amorphous film 50 (see FIG. 3(A)).

Next, a polysilicon film 65 is formed on the high dielectric amorphous film 50 by, for example, an arbitrary and suitable known chemical vapor deposition (CVD) method. Since a deposition temperature of the polysilicon film 65 is 600° C. or higher, the high dielectric amorphous film 50 is crystallized upon deposition of the polysilicon film 65, thus resulting in a high dielectric crystal film 55 (see FIG. 3 (B).

A laminated structure of the high dielectric crystal film 55 and the polysilicon film 65 formed over the base substrate 11 is next etched to pattern the polysilicon film 65. A photoresist is first applied onto the polysilicon film 65 and thereafter patterned by a photolithography method to form photoresist masks 70. The photoresist masks 70 are formed so as to cover portions of the polysilicon film 65 corresponding to gate forming regions 72 and expose portions of the polysilicon film 65 corresponding to gate non-forming regions 74 (see FIG. 3(C)).

Next, dry etching with the photoresist masks 70 as etching masks is performed to thereby remove the portions of the polysilicon film 65 corresponding to the gate non-forming regions 74 and allow the portions of the polysilicon film 65 corresponding to the gate forming regions 72 to remain. The remaining portions of the polysilicon film 65 are constituted as gate electrodes 67 respectively (see FIG. 3(D)). Incidentally, the present dry etching includes a main process executed using a mixed gas of HBr and $O_2$ and an overetching process executed using a mixed gas of HBr, $O_2$ and He.

After the formation of the gate electrodes 67, an etching gas is changed over to one or two or more inert gases selected from an inert gas group comprising He, Ne, Ar, Kr and Xe to perform plasma processing. Incidentally, the plasma processing is continuously performed without exposure to atmospheric air within an apparatus having performed the dry etching for forming the gate electrodes 67. In the plasma processing, the portions of the high dielectric crystal film 55, which are exposed to the gate non-forming regions 74 by patterning of the polysilicon film 65, are exposed to plasma of one or two or more inert gases selected from the inert gas group composed of He, Ne, Ar, Kr and Xe. The portions of the high dielectric crystal film 55 exposed to the plasma are subjected to damage by the plasma processing, so that the portions thereof are reformed into damage layers, i.e., amorphous high dielectric films (high dielectric amorphous films) 58 (see FIG. 3(E)). Since the gate electrodes 67 are covered with the photoresist masks 70 respectively at this time, they resist damage. Since the inert gas is used as a reaction gas, side etching of each gate electrode 67 is hard to occur too.

Next, the photoresist masks 70 are removed by ashing. Thereafter, the high dielectric amorphous films 58 corresponding to the gate non-forming regions 74 are removed by wet etching with the gate electrodes 67 as masks (see FIG. 3(F)).

After the removal of the high dielectric amorphous films 58 corresponding to the gate non-forming regions 74, for example, the formation of sidewalls, the formation of an LDD (Light Doped Drain) structure and the like may be executed in accordance with the conventional known process. Their explanations will therefore be omitted here.

According to the semiconductor elemental device manufacturing method of the second embodiment, the high dielectric crystal film corresponding to the gate non-forming regions is reformed into the high dielectric amorphous films by the plasma processing using the inert gas, after which they are removed by wet etching. It is thus possible to avoid a reduction in etching rate due to the crystallization of the high dielectric film.

Since the plasma processing using the inert gas is performed, only the high dielectric crystal film exposed to each gate non-forming region can be damaged. Thus, the thinning or the like of each gate electrode by side etching at the time of amorphization of the high dielectric film is avoided and a stable manufacturing process of a semiconductor elemental device can be constructed.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor elemental device, comprising:
   preparing a base substrate;
   forming a high dielectric amorphous film composed of a high permittivity material over the base substrate;
   forming an amorphous silicon film over the high dielectric amorphous film using an amorphization temperature of the high permittivity material as a deposition temperature of the amorphous silicon film;
   forming photoresist masks over the amorphous silicon film in gate forming regions by photolithography;
   removing the amorphous silicon film in gate non-forming regions by dry etching using the photoresist masks to expose the high dielectric amorphous film and so that the amorphous silicon film in the gate forming regions remain as gate electrode forming films;
   removing the photoresist masks;
   performing wet etching with the gate electrode forming films as masks after said removing the photoresist masks, so that portions of the high dielectric amorphous film covered by the gate electrode forming films remain and so that exposed portions of the high dielectric amorphous film are removed; and
   heat-treating the remaining gate electrode forming films after said performing wet etching, to reform the remaining gate electrode forming films into polysilicon gate electrodes.

2. The method according to claim 1, wherein the base substrate is provided as including device isolation insulating layers in an SOI layer of an SOI substrate.

3. A method for manufacturing a semiconductor elemental device, comprising:
   forming an amorphous high dielectric film over a substrate;
   forming an amorphous silicon film over the amorphous high dielectric film at a temperature lower than a temperature at which the amorphous high dielectric film is crystallized;
   patterning the amorphous silicon film and the amorphous high dielectric film; and
   heat-treating the patterned amorphous silicon film to thereby crystallize the patterned amorphous silicon film.

4. The method according to claim 3, wherein during said heat-treating, the patterned amorphous silicon film is reformed into a polycrystalline silicon film.

5. The method according to claim 3, wherein said patterning includes patterning the amorphous silicon film, and patterning the amorphous high dielectric film with the patterned amorphous silicon film as a mask.

6. The method according to claim 4, wherein said patterning includes patterning the amorphous silicon film, and patterning the amorphous high dielectric film with the patterned amorphous silicon film as a mask.

7. The method according to claim 5, wherein said patterning the amorphous high dielectric film is performed using wet etching.

8. The method according to claim 6, wherein said patterning the amorphous high dielectric film is performed using wet etching.

9. The method according to claim 3, wherein the substrate includes a silicon layer formed on an insulating layers, and the amorphous high dielectric film is formed on the silicon layer.

* * * * *